(12) United States Patent
Lin et al.

(10) Patent No.: US 9,698,024 B2
(45) Date of Patent: Jul. 4, 2017

(54) PARTIAL SOI ON POWER DEVICE FOR BREAKDOWN VOLTAGE IMPROVEMENT

(71) Applicant: Taiwan Semiconductor Manufacturing Co. Ltd., Hsin-Chu (TW)

(72) Inventors: Long-Shih Lin, Zhubei (TW); Fu-Hsiung Yang, Zhongli (TW); Kun-Ming Huang, Taipei (TW); Ming-Yi Lin, Hsin-Chu (TW); Paul Chu, New Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/330,092

(22) Filed: Jul. 14, 2014

(65) Prior Publication Data

US 2014/0322871 A1    Oct. 30, 2014

Related U.S. Application Data

(63) Continuation-in-part of application No. 13/706,975, filed on Dec. 6, 2012, now Pat. No. 8,779,555.

(51) Int. Cl.
*H01L 21/308*    (2006.01)
*H01L 29/66*    (2006.01)
(Continued)

(52) U.S. Cl.
CPC ........ *H01L 21/308* (2013.01); *H01L 21/3083* (2013.01); *H01L 29/66325* (2013.01);
(Continued)

(58) Field of Classification Search
None
See application file for complete search history.

(56) References Cited

U.S. PATENT DOCUMENTS 5,004,705 A    4/1991    Blackstone
5,036,021 A    7/1991    Goto
(Continued)

FOREIGN PATENT DOCUMENTS

WO    0225700 A2    3/2002

OTHER PUBLICATIONS

Radhakrishnan Sithanandam, et al.; "Linearity and Speed Optimization in SOI LDMOS Using Gate Engineering"; Semiconductor Science and Technology; IOP Publishing 2010; p. 1-7.
(Continued)

*Primary Examiner* — Yu Chen
*Assistant Examiner* — Nilufa Rahim
(74) *Attorney, Agent, or Firm* — Eschweiler & Potashnik, LLC (57) ABSTRACT

Some embodiments of the present disclosure relate to a method to increase breakdown voltage of a power device. A power device is formed on a silicon-on-insulator (SOI) wafer made up of a device wafer, a handle wafer, and an intermediate oxide layer. A recess is formed in a lower surface of the handle wafer to define a recessed region of the handle wafer. The recessed region of the handle wafer has a first handle wafer thickness, which is greater than zero. An un-recessed region of the handle wafer has a second handle wafer thickness, which is greater than the first handle wafer thickness. The first handle wafer thickness of the recessed region provides a breakdown voltage improvement for the power device.

20 Claims, 10 Drawing Sheets (51) Int. Cl.
| | | |
|---|---|---|
| *H01L 29/78* | (2006.01) | |
| *H01L 29/739* | (2006.01) | |
| *G01R 31/12* | (2006.01) | |
| *H01L 29/08* | (2006.01) | |
| *G01R 31/26* | (2014.01) | |
| *H01L 21/762* | (2006.01) | |

(52) U.S. Cl.
CPC .... *H01L 29/66689* (2013.01); *H01L 29/7394* (2013.01); *H01L 29/7824* (2013.01); *G01R 31/129* (2013.01); *G01R 31/2637* (2013.01); *H01L 21/76275* (2013.01); *H01L 21/76283* (2013.01); *H01L 29/086* (2013.01)

(56) References Cited

U.S. PATENT DOCUMENTS

| | | | |
|---|---|---|---|
| 5,776,813 | A | 7/1998 | Huang et al. |
| 5,807,783 | A | 9/1998 | Gaul et al. |
| 6,265,752 | B1 | 7/2001 | Liu et al. |
| 6,486,034 | B1 | 11/2002 | Huang et al. |
| 6,500,717 | B2 | 12/2002 | Goodwin et al. |
| 6,703,684 | B2 | 3/2004 | Udrea et al. |
| 6,858,884 | B2 | 2/2005 | Udrea |
| 7,067,881 | B2 | 6/2006 | Matsumoto et al. |
| 7,508,032 | B2 | 3/2009 | Chiang et al. |
| 7,768,071 | B2 | 8/2010 | Huang et al. |
| 7,915,674 | B2 | 3/2011 | Chang et al. |
| 7,955,969 | B2 | 6/2011 | Kinzer et al. |
| 8,129,783 | B2 | 3/2012 | Huang et al. |
| 2002/0041003 | A1 | 4/2002 | Udrea et al. |
| 2002/0050614 | A1* | 5/2002 | Unnikrishnan ..... H01L 29/1083 257/347 |
| 2004/0178443 | A1 | 9/2004 | Hossain et al. |
| 2005/0242369 | A1 | 11/2005 | Udrea et al. |
| 2005/0282306 | A1 | 12/2005 | Yamanaka |
| 2006/0022263 | A1 | 2/2006 | Haase et al. |
| 2006/0197156 | A1 | 9/2006 | Amaratunga et al. |
| 2007/0252243 | A1 | 11/2007 | Ohmi et al. |
| 2009/0160015 | A1* | 6/2009 | Udrea ................. H01L 21/8249 257/522 |
| 2010/0032712 | A1 | 2/2010 | Udrea et al. |
| 2011/0057230 | A1* | 3/2011 | Udrea ............... H01L 29/66325 257/141 |
| 2012/0068311 | A1 | 3/2012 | Yamazaki |
| 2012/0104554 | A1 | 5/2012 | Eden et al. |
| 2012/0119318 | A1 | 5/2012 | Tokura et al. |
| 2013/0280831 | A1* | 10/2013 | Vaeth ....................... B41J 2/162 438/21 |

OTHER PUBLICATIONS

B. Bakeroot, et al.; "Using Adaptive Resurf Technique and Field Plate Working to Improve the Safe Operating Area of n-type Drain Extended MOS Transistor"; ELIS-TFCG/IMEC, University of Gent, Nanotech 2011 vol. 1, p. 1-4.

Taylor Efland, et al.; "An Optimized RESURF LDMOS Power Device Module Compatible with Advanced Logic Processes"; Texas Instruments Incorporated; 1992 IEEE; p. 9.4.1-9.4.4.

Luo, X.R. "A High Voltage Silicon-on-Insulator Lateral Insulated Gate Bipolar Transistor with a Reduced Cell-Pitch", Chin. Phys. B. vol. 22, No. 2 (2013) pp. 027303.

Bertrand, I., et al., "New Lateral DMOS and IGBT Structures Realized on a Partial SOI Substrate Based on LEGO Process", IEEE BCTM 5.2 (2005).

Tee, E., "200V Superjunction n-type Lateral Insulated Gate Bipolar Transistor with Improved Latch-up Characteristics", IEEE Transactions on Electron Devices, vol. 60, No. 4, (Apr. 2013) pp. 1412-1515.

Beggans, M. "Ultrathin Silicon Wafer Bonding: Physics and Applications", Diss., Federated Physics Department, New Jersey Institute of Technology May 2001.

Office Action Dated Nov. 29, 2013 U.S. Appl. No. 13/706,975.

Notice of Allowance Dated Mar. 12, 2014 U.S. Appl. No. 13/706,975.

\* cited by examiner

Fig. 7 too long, skipping full OCR in this example

PARTIAL SOI ON POWER DEVICE FOR BREAKDOWN VOLTAGE IMPROVEMENT

REFERENCE TO RELATED APPLICATION

This application is a continuation in part of U.S. application Ser. No. 13/706,975 which was filed on Dec. 6, 2012 and the contents of which are incorporated by reference herein.

BACKGROUND

Ultra-high voltage (UHV) power devices, such as laterally diffused metal oxide semiconductors (LDMOSs) and laterally insulated gate bipolar transistors (LIGBTs), are utilized in integrated circuits (ICs) mainly for high-voltage switching and power applications, due to their high efficiency relative to other devices such as metal oxide semiconductor field-effect transistors (MOSFETs). UHV power devices can be fabricated on both bulk silicon substrates or silicon-on-insulator (SOI) substrates.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

UHV power devices, such as laterally diffused metal oxide semiconductors (LDMOSs) and laterally insulated gate bipolar transistors (LIGBTs), are often formed on silicon-on-insulator (SOI) substrates made up of a device wafer, a handle wafer, and an intermediate oxide layer, which bonds the device wafer to the handle wafer. SOI substrates provide an attractive alternative to bulk silicon substrates, because the intermediate oxide layer provides isolation to the power device to prevent leakage and improve device performance. For a power device formed on silicon-on-insulator (SOI) substrate, a breakdown voltage of the power device (i.e., a maximum voltage which the power device can sustain without acting as a conductor, resulting from dielectric breakdown within the device wafer) is dependent on the thickness of both the device wafer and the oxide layer, because both determine a maximum strength of the electric an electric field that can be sustained within the power device. For power devices formed on SOI, increasing a thickness of the intermediate oxide layer can increase the breakdown voltage, but may also have unintended effects such as increasing defect densities within the power device, which can degrade device performance.

Accordingly, the present disclosure relates to a method to increase breakdown voltage of a power device. A power device is formed on an SOI wafer made up of a device wafer, a handle wafer, and an intermediate oxide layer. A recess is formed in a lower surface of the handle wafer to define a recessed region of the handle wafer. The recessed region of the handle wafer has a first handle wafer thickness, which is greater than zero. An un-recessed region of the handle wafer has a second handle wafer thickness, which is greater than the first handle wafer thickness. The first handle wafer thickness of the recessed region provides a breakdown voltage improvement for the power device.

Figure 1A:
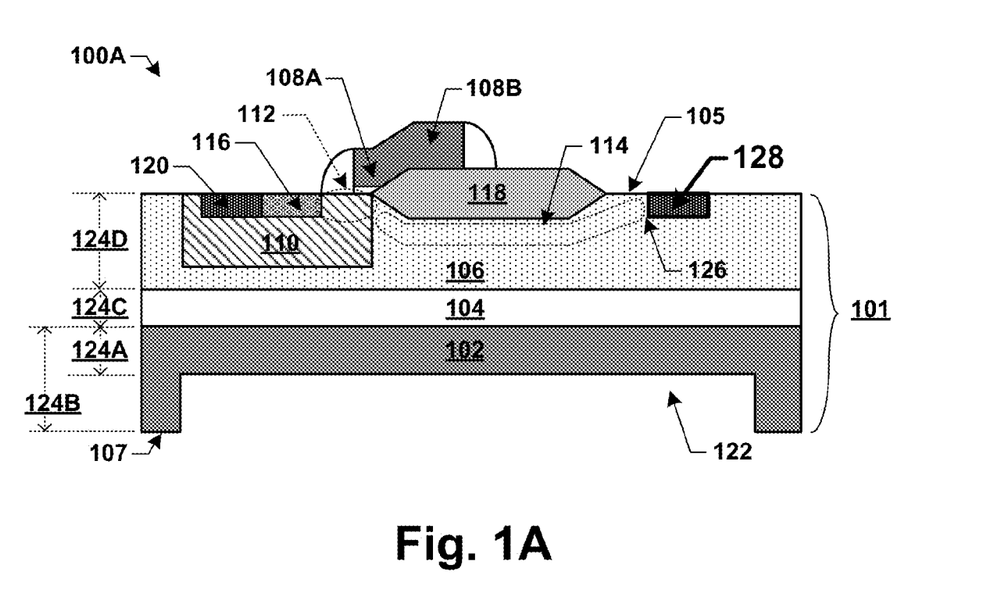
FIG. 1A illustrates a cross-sectional view of some aspects of a laterally insulated gate bipolar transistor (LIGBT).

FIG. 1A illustrates a cross-sectional view of some aspects of a laterally insulated gate bipolar transistor (LIGBT) 100A formed on an SOI substrate 101, which comprises a handle wafer 102 (e.g., silicon), and an n-type device wafer 106 (e.g., an N− silicon epitaxial layer), which are separated by an intermediate oxide layer 104 (e.g., $SiO_2$). The LIGBT 100A is essentially a combination of a pnp-bipolar transistor, which provides high current handling capability, and an n-channel metal oxide semiconductor field-effect transistor (MOSFET), which provides high-impedance voltage control. The LIGBT 100A includes a gate 108A disposed on an upper surface 105 of the device wafer 106, and over a channel region 112 of a p-type well 110. A field plate 108B is disposed over a field dielectric layer 118, and over the upper surface of the device wafer 106. The gate 108A and the field plate 108B are formed from a single conductive material (e.g., polysilicon). The field plate 108B prevents a large electric field concentration near an edge of the gate 108A, and thusly improves electron diffusion within an n-drift region 114, arranged between a cathode/emitter (p-type well 110) and an anode/collector 128, of the LIGBT 100A.

A recess 122 is formed in a lower surface 107 of the handle wafer 102. The recess 122 defines a recessed region of the handle wafer 102 with a first handle wafer thickness 124A which is greater than zero. An un-recessed region of the handle wafer 102 has a second handle wafer thickness 124B that is greater than the first handle wafer thickness 124A. The recessed region of the handle wafer 102 provides for an increased breakdown voltage of the LIGBT 100A relative to the LIGBT 100A without a recessed region, and increases the breakdown voltage without increasing a third thickness 124C of the intermediate oxide layer 104. In addition, the recessed region also provides for a decrease in a fourth thickness 124D of the device wafer 106 to achieve a comparable breakdown voltage to the LIGBT 100A without a recessed region. For a LIGBT 100A formed on an SOI substrate 101 comprising a device wafer 106 formed epitaxially, the decreased fourth thickness 124D results in less manufacturing time, and increased throughput.

The anode/collector 128 is formed from a first p-type shallow doped region within the upper surface 105 of the device wafer 106. The p-type well 110, which forms the emitter of the LIGBT 100A contains a first n-type shallow doped region 116 (e.g., N+), and a second p-type shallow doped region 120 (e.g., P+). In most instances, the n-type and second p-type shallow doped region 116, 120 are connected together. When a positive voltage above a threshold voltage ($V_{th}$) of the LIGBT 100A is applied with respect to the cathode/emitter (p-type well 110), an inversion channel is formed in the channel region 112 that connects the first n-type shallow doped region 116 to the n-drift region 114. If a positive voltage is applied between the anode/collector 128 and the cathode/emitter (p-type well 110), a voltage drop occurs across the junction 126 until it becomes forward biased. Holes from the anode/collector 128 are injected into n-drift region 114, and electrons flow into the n-drift region 114 from the first n-type shallow doped region 116 through the channel region 112. The electrons and holes recombine within the n-drift region, and current flows between the cathode/emitter (p-type well 110) and the anode/collector 128.

The LIGBT 100A is configured to support elevated voltage conditions over associated logic devices for a given integrated circuit (IC) application. The LIGBT 100A is utilized for such applications as System on Chip (SoC) ICs. SoC technology achieves system-level functionality on a single chip by integrating logic and analog fabrication processes. Cost-effective SoC technology requires low cost high-performance power devices to drive multiple loads supporting multiple power domains within the SoC. This type of drive may be achieved with a charge pump, but requires additional manufacturing complexity. The LIGBT 100A can also achieve the desired voltages needed for SoC applications and can be formed using a same manufacturing method as logic devices of the SoC, thus adding no additional manufacturing complexity.

Figure 1B:
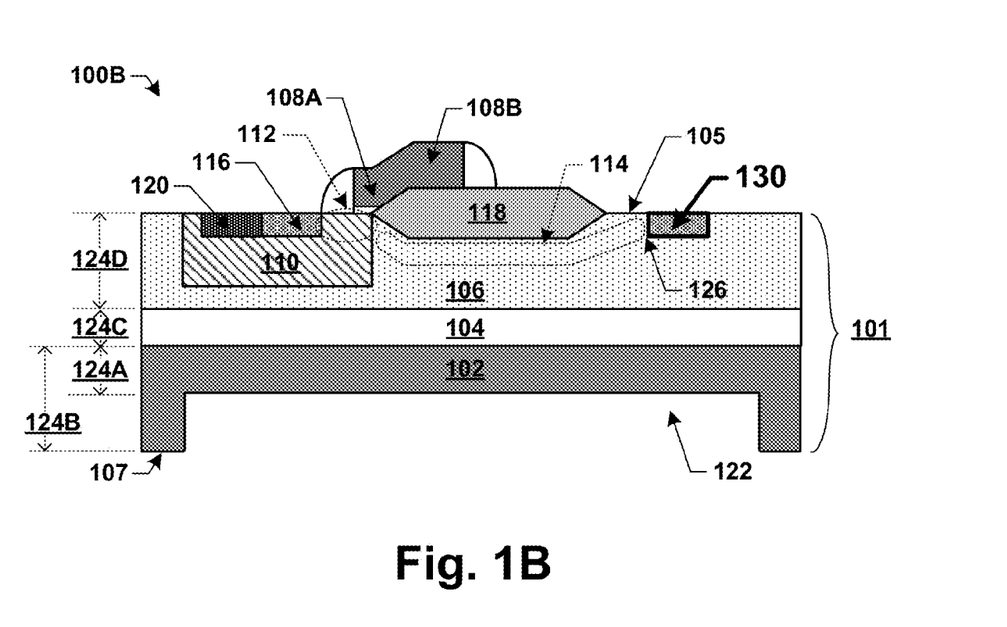
FIG. 1B illustrates a cross-sectional view of some aspects of laterally diffused metal oxide semiconductor (LDMOS).

FIG. 1B illustrates a cross-sectional view of some aspects of laterally diffused metal oxide semiconductor (LDMOS) 100B. The LDMOS 100B is substantially identical to the LIGBT 100A. The main difference is that the LDMOS 100B has a second n-type shallow doped region 130 formed in place of the first p-type shallow doped region 128, which forms the anode/collector 128 of LIGBT 100A. Instead, the second n-type shallow doped region 130 forms a drain region of the LDMOS 100B, and the first n-type shallow doped region 116 forms a source region of the LDMOS 100B. When a positive voltage greater than $V_{th}$ is applied to the gate 108A of the LDMOS 100B, an inversion channel is formed in the channel region 112 that connects the first n-type shallow doped region 116 to the n-drift region 114. As a result, current in the form of electrons flows between the source region (the first n-type shallow doped region 116) and the drain region (the second n-type shallow doped region 130). For the LDMOS 100B, there is a trade-off between the breakdown voltage and a resistance of the n-drift region 114.

FIGS. 2A-2K illustrate a series of cross-sectional views that collectively depict formation of the LIGBT 100A on a bonded wafer. It is appreciated that formation of the LDMOS 100B is substantially similar. Differences between the formation of the LIGBT 100A of the formation of the LDMOS 100B are highlighted in the appropriate cross-sectional views of FIGS. 2A-2K.

Figure 2A:
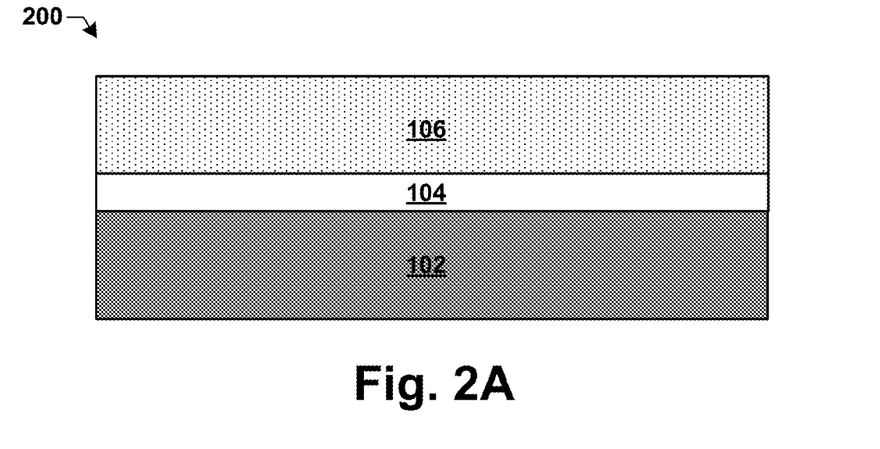
FIGS. 2A-2K illustrate a series of cross-sectional views that collectively depict formation of an LIGBT on a bonded wafer.

FIG. 2A illustrates a bonded SOI wafer 200 formed by oxidizing a surface of a device wafer 106 to create an intermediate oxide layer 104, and bonding the device wafer 106 to a handle wafer 102 with the intermediate oxide layer 104. For the embodiments of FIGS. 2A-2K, the device wafer 106 comprises a lightly-doped n-type substrate (e.g., N−). In some embodiments, the device wafer 106 is formed epitaxially. In some embodiments, an area of a power device is laterally isolated using trench isolation structures 302B to prevent current leakage from the power device, as illustrated in FIG. 3B.

Figure 2B:
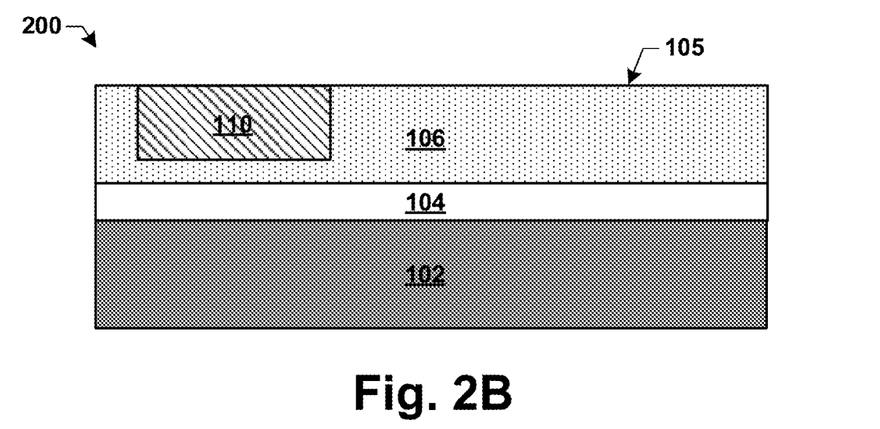

In FIG. 2B, a first implant is performed into an upper surface 105 of the device wafer 106 to form a p-type well 110. The p-type well 110 is formed through diffusion or implantation of acceptor dopants (e.g., boron). For the embodiments of FIGS. 2A-2K, the p-type well 110 forms an emitter/anode of the LIGBT 100A.

Figure 2C:
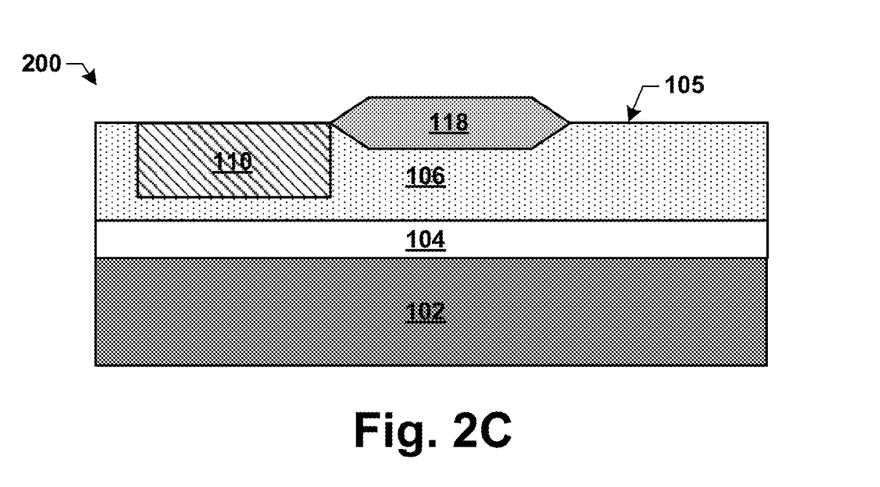

In FIG. 2C, a field dielectric layer 118 (e.g., TEOS) is disposed over the upper surface 105 of the device wafer 106.

Figure 2D:
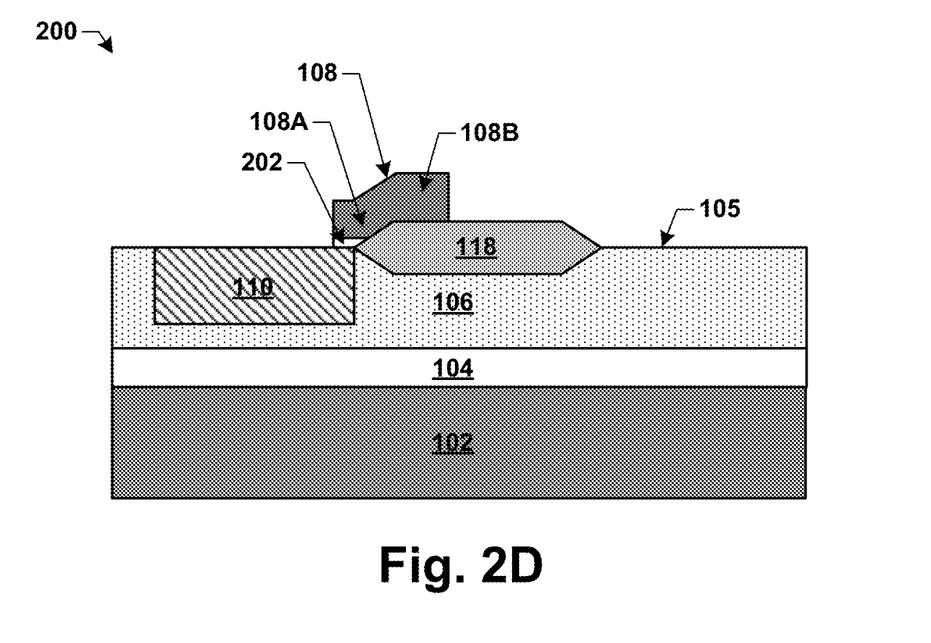

In FIG. 2D, a gate dielectric 202 is disposed over a portion of the p-type well 110. Subsequently, a gate material 108 (e.g., polysilicon) is disposed over the gate dielectric 202 and over the field dielectric layer 118. A first portion of the gate material 108 arranged over the gate dielectric 202 forms a gate 108A, and a second portion of the gate material 108 disposed over the field dielectric layer 118 forms a field plate 108B, which is electrically-isolated from the device wafer by the field dielectric layer 118. In some embodiments, formation of the gate dielectric 202 and the gate material 108 comprises disposal of a gate dielectric layer (e.g., $SiO_2$) over the upper surface 105 of the device wafer 106, followed by disposal of a gate material layer (e.g., polysilicon) over the gate dielectric layer. The gate dielectric and gate material layers are then patterned and etched to form the gate dielectric 202 and gate material 108 of FIG. 2D.

Figure 2E:
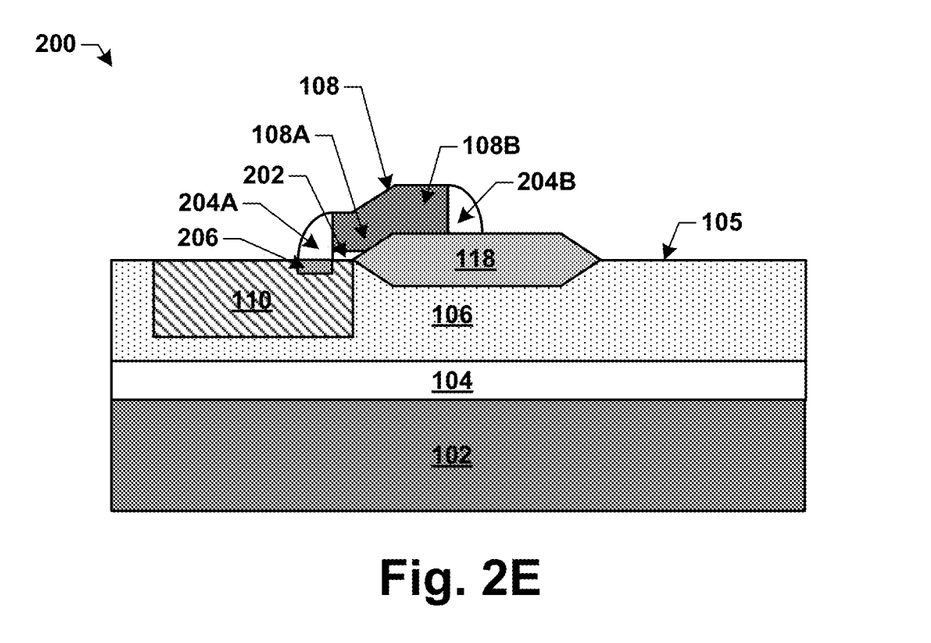

In FIG. 2E, first and second sidewall spacers 204A, 204B are disposed along opposite sidewalls of the gate material 108. To mitigate hot carrier effects, an n-type lightly-doped drain (LDD) region 206 (e.g., N−) is implanted into the p-type well 110 below the first sidewall spacer 204A.

Figure 2F:
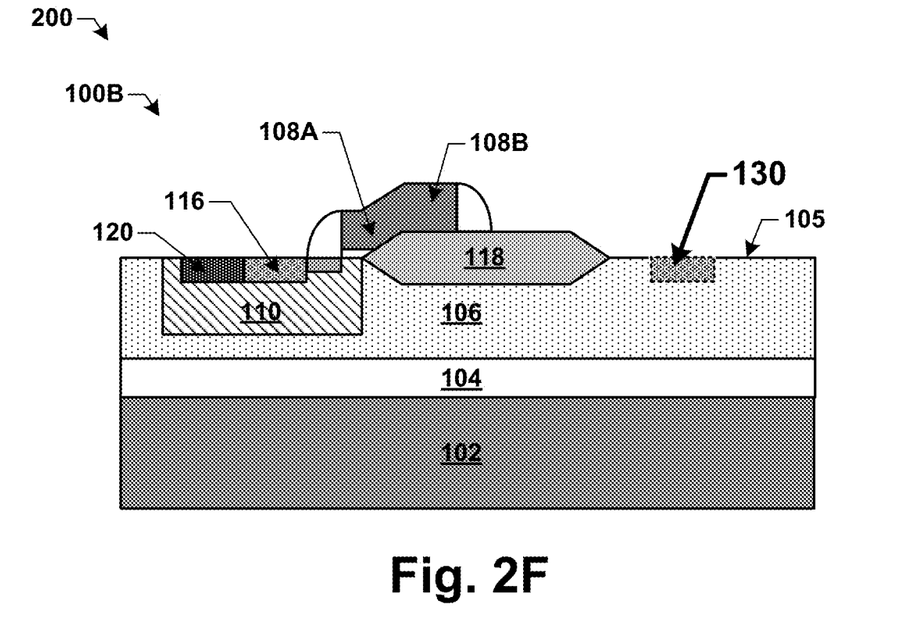
Figure 2G:
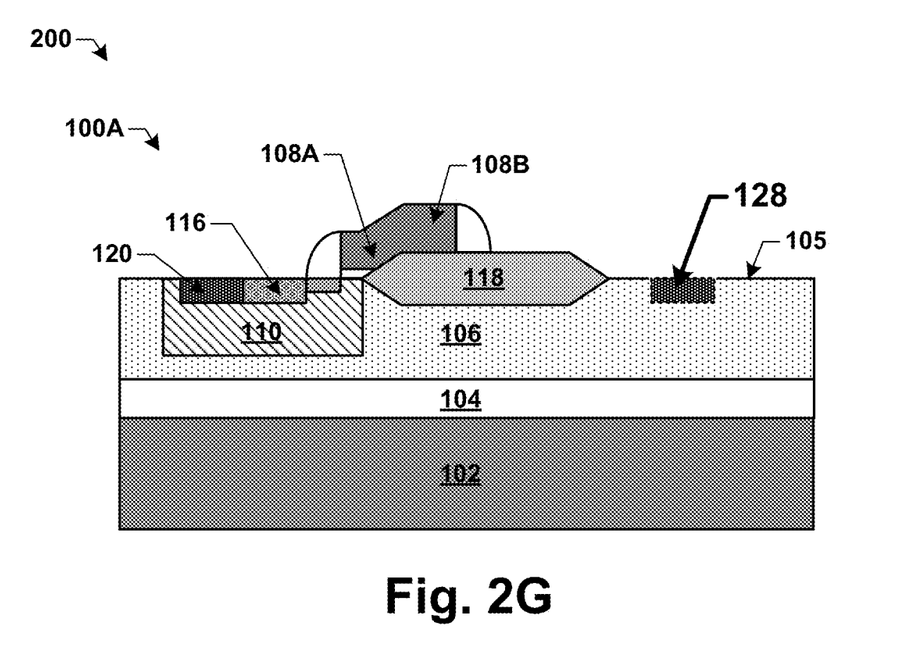

FIG. 2F illustrates an alternative step to FIG. 2G. When performed in place of FIG. 2G, the step of FIG. 2F, and subsequent steps illustrated in the cross-sectional views of FIGS. 2H-2K, result in the formation of the LDMOS 100B. In FIG. 2F, a second implant (e.g., an ion implant) is performed into the upper surface 105 of the device wafer 106 within the p-type well 110 adjacent the gate 108A to form a first n-type shallow doped region 116, which acts as the source of the LDMOS 100B. The second implant also forms a second n-type shallow doped region 130 in the upper surface 105 of the device wafer 106 on an opposite side of the gate 108A from the first n-type shallow doped region 116, to form a drain region of the LDMOS 100B. A third implant is then performed within the p-type well 110 adjacent the first n-type shallow doped region 116 to form a second p-type shallow doped region 120, which acts a contact to a body of the LDMOS 100B, which is formed by the p-type well 110.

Alternatively, as shown in FIG. 2G, to form the LIGBT 100A instead of the LDMOS 100B, the second implant can be restricted to form only the first n-type shallow doped region 120 within the p-type well 110, but not the second n-type shallow doped region 130. Subsequently, the third implant forms a first p-type shallow doped region 128 in a location where the second n-type shallow doped region 130 had been formed in FIG. 2F. Subsequent steps illustrated in the cross-sectional views of FIGS. 2H-2K show the completion of the LIGBT 100A. However, replacing the first p-type shallow doped region 128 with the second n-type shallow doped region 130 will alternatively result in formation of the LDMOS 100B.

Figure 2H:
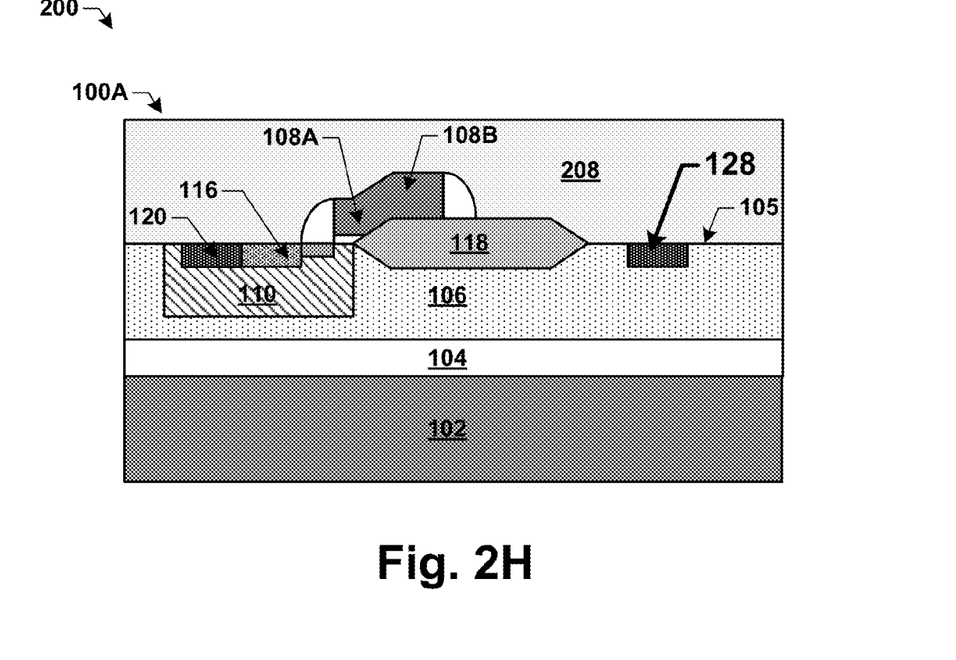

In FIG. 2H, an inter-layer dielectric (ILD) 208 is formed over the upper surface 105 of the device wafer 106 to isolate the LIGBT 100A.

Figure 2I:
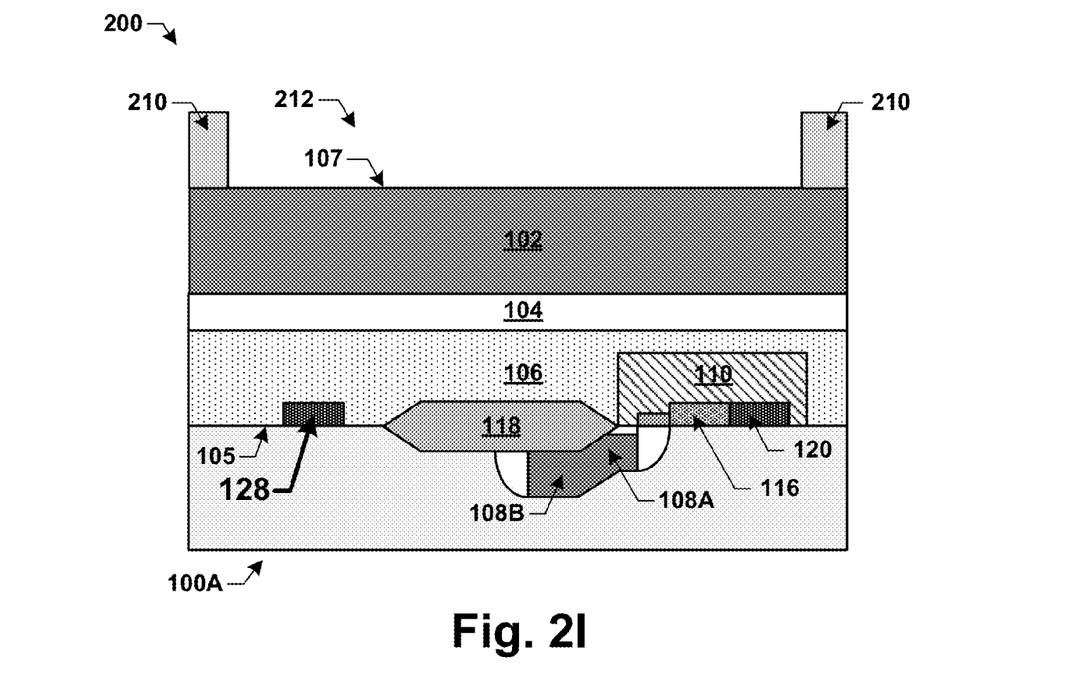

In FIG. 2I, the bonded SOI wafer 200 is flipped for selective removal of sections of the handle wafer 102. A lower surface 107 of the handle wafer 102 is coated with photoresist 210 (e.g., positive photoresist) with a spin-coating apparatus, and aligned with a photomask containing a pattern that comprises an opening 212 above the lower surface 107. The coated lower surface 107 of the handle wafer 102 is exposed to radiation to transfer the opening 212 into the photoresist 210.

Figure 2J:
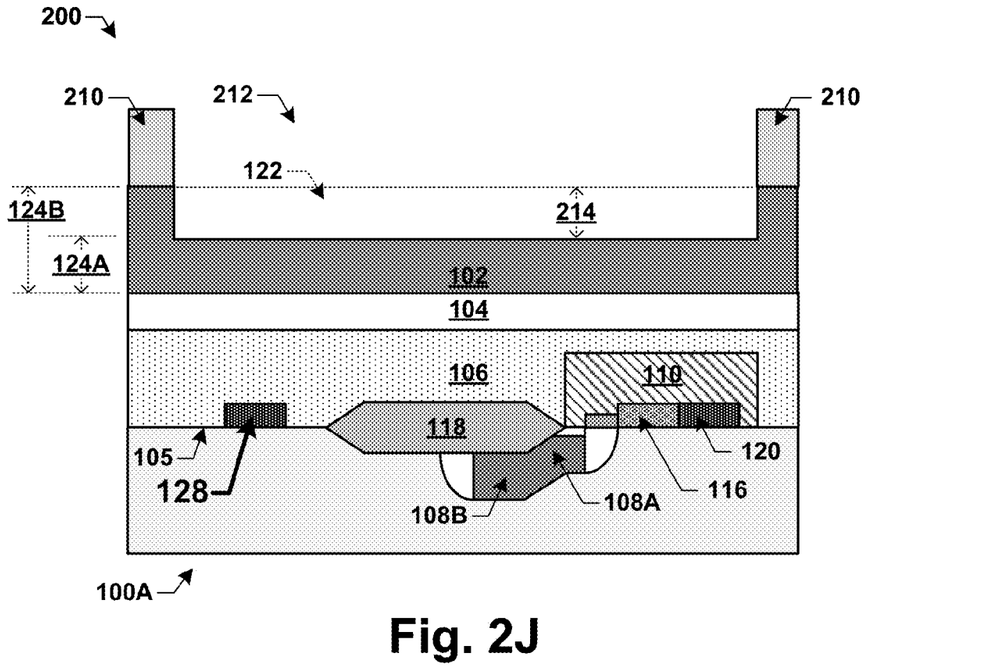

In FIG. 2J, the opening 212 is etched into the lower surface 107 of the handle wafer 102 to a first depth 214 to form a recess 122 within a recessed region of the handle wafer 102. The recessed region resides within a vicinity of the LIGBT 100A. For the embodiments of FIGS. 2A-2K, the recessed region comprises a section of the handle wafer 102 above the LIGBT 100A, which is essentially fully removed. Note that in a regular orientation the recessed region resides below the LIGBT 100A. To avoid confusion it is said that the recessed region resides over the LIGBT 100A, regardless of the orientation. The recessed region has a first handle wafer thickness 124A which is greater than zero. An un-recessed region of the handle wafer 102 has a second handle wafer thickness 124B that is greater than the first handle wafer thickness 124A. A difference between the second ad first handle wafer thicknesses 124B, 124A is about equal to the first depth 214 of the recess etch.

Figure 2K:
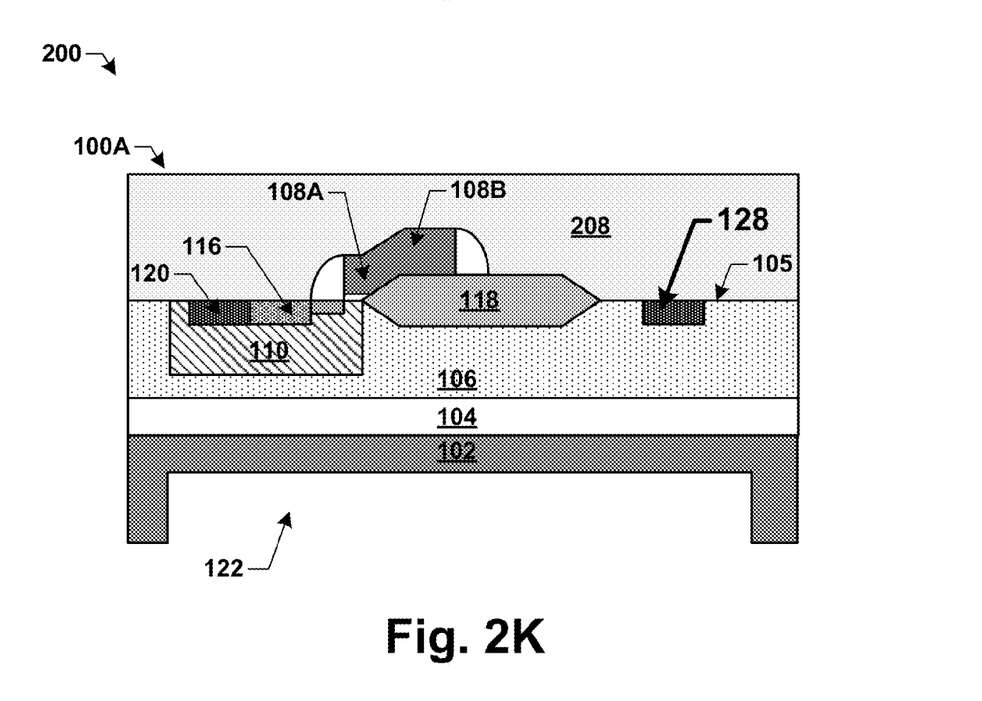

In FIG. 2K, the photoresist 210 is removed, and the bonded SOI wafer 200 is flipped back to its original orientation.

Figure 3A:
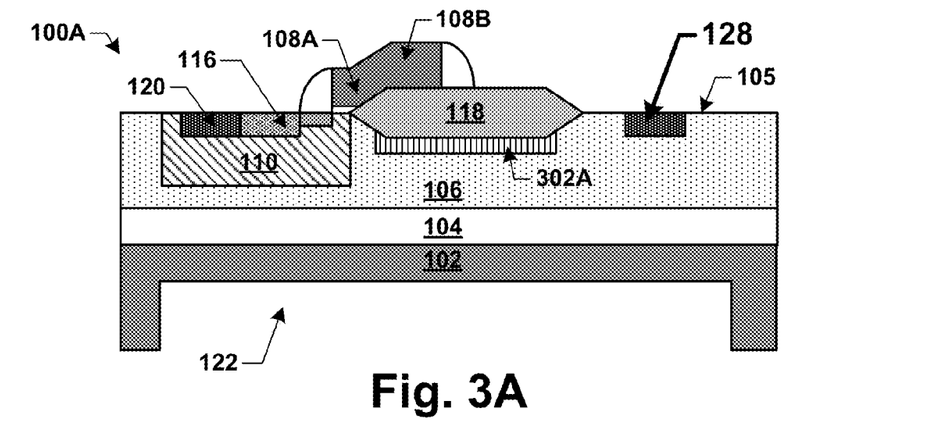
FIGS. 3A-3C illustrate cross-sectional views of some embodiments of LIGBTs.
Figure 3B:
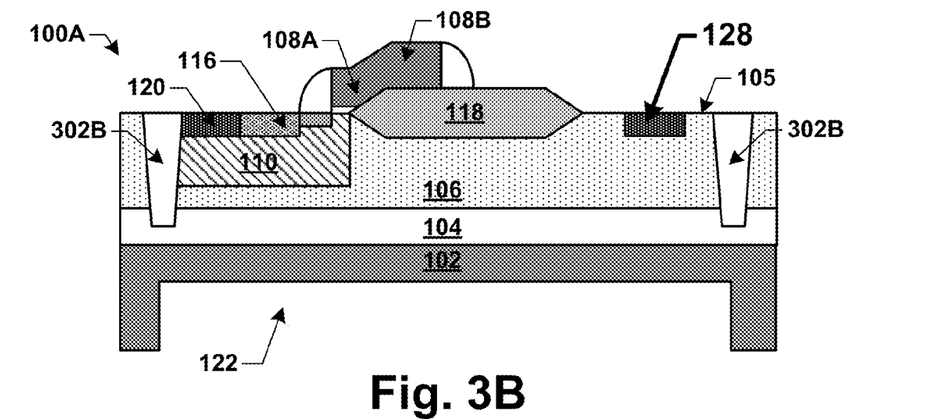
Figure 3C:
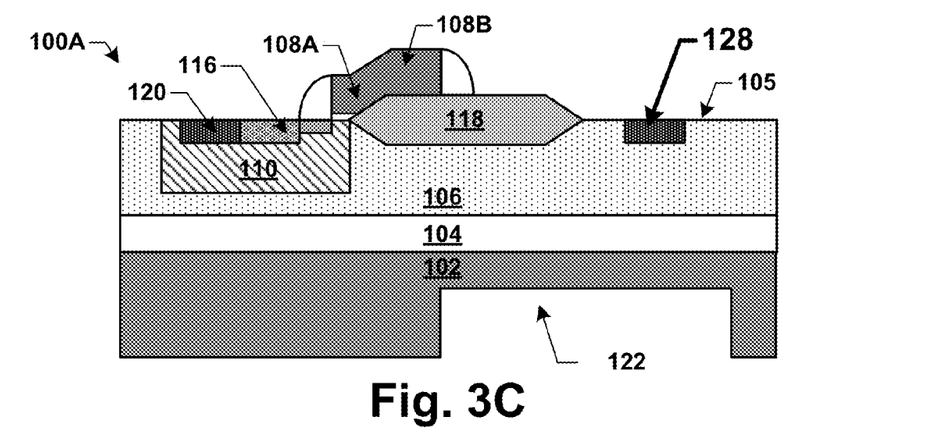

FIGS. 3A-3C illustrate cross-sectional views of some embodiments of LIGBTs. While the embodiments illustrated with respect to the LIGBT 100A, it is appreciated that the elements set forth in FIGS. 3A-3C may be alternatively applied to the LDMOS 100B as well.

In FIG. 3A, the LIGBT 100A a region near the upper surface 105 of the device wafer 106 as been is doped with an acceptor (i.e., a group IV element such as boron, aluminum, or gallium) prior to disposing the field dielectric layer 118 to form a p-type ring, or "p-ring" 302A. The field dielectric layer 118 and the p-ring 302A in conjunction utilize a RESURF (REduced SURface Field) technique, which distributes the electric field lines under the field dielectric layer 118 in a lateral direction towards the anode/collector 128 of LIGBT 100A to reduce current crowding and increases the breakdown voltage of the LIGBT 100A.

In FIG. 3B, the LIGBT 100A is laterally isolated using trench isolation structures 302B to prevent current leakage.

In FIG. 3C, the recessed region (122) of the handle wafer 102 extends between the gate 108A and the anode/collector 128, and the un-recessed region of the handle wafer 102 extends beneath the emitter/anode (110).

Figure 4:
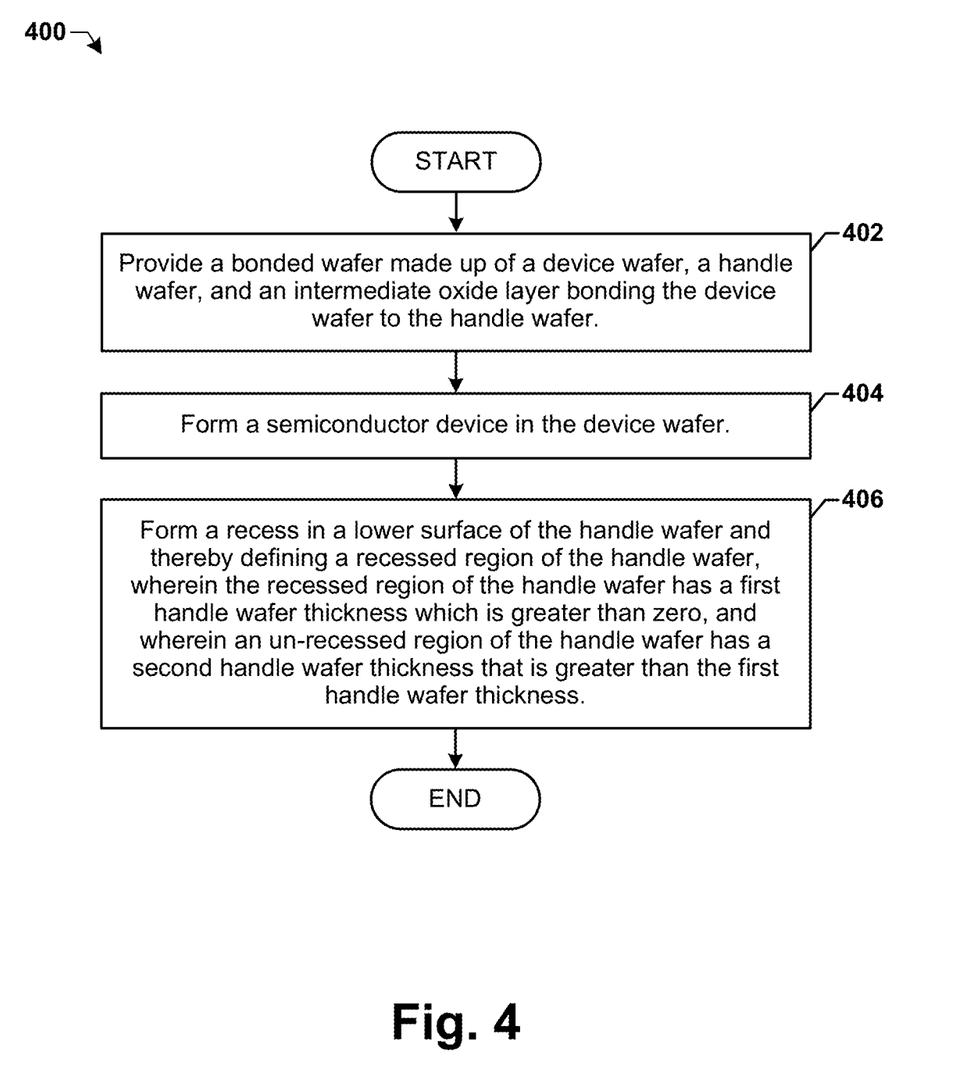
FIG. 4 illustrates a method of power device fabrication.

FIG. 4 illustrates a flow chart of some embodiments of a method 400 a method of power device fabrication.

At 402 a bonded wafer is provided. The bonded wafer is made up of a device wafer, a handle wafer, and an intermediate oxide layer bonding the device wafer to the handle wafer.

At 404 a semiconductor device is formed in the device wafer. In some embodiments, the semiconductor device comprises an LIGBT. In other embodiments, the semiconductor device comprises an LDMOS.

At 406 a recess is formed in a lower surface of the handle wafer, and thereby defines a recessed region of the handle wafer. The recessed region of the handle wafer has a first handle wafer thickness, which is greater than zero, and wherein an un-recessed region of the handle wafer has a second handle wafer thickness that is greater than the first handle wafer thickness. In some embodiments the recessed region extends below the entire semiconductor device. In other embodiments, the recessed region extends only below a portion of the devices. In some embodiments of a semiconductor device comprising an LIGBT, the recess region extends between a gate and a drain region of the LIGBT, and the un-recessed region extends beneath a source region of the LIGBT. In some embodiments of a semiconductor device comprising an LDMOS, the recess region extends between a gate and an anode/collector of the LDMOS, and the un-recessed region extends beneath a cathode/emitter of the LDMOS.

Figure 5A:
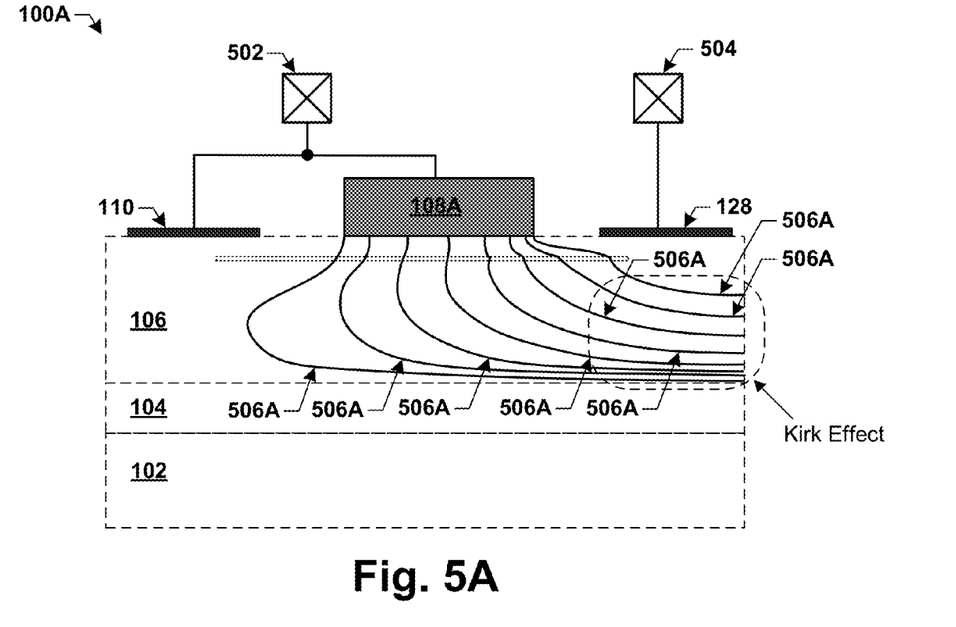
FIGS. 5A-5B illustrate some embodiments of a breakdown voltage measurement in accordance with the present disclosure.

FIG. 5A illustrates some embodiments of a breakdown voltage measurement for the LIGBT 100A formed on a bonded wafer. The gate 108A and the emitter/anode (110) are coupled to a ground pad 502. The anode/collector 128 is coupled to a power pad 504, which supplies a voltage to the LIGBT 100A resulting in a reverse bias. Under these biasing conditions, a "RESURF effect" distributes electric potential lines 506A over a part of the LIGBT 100A in a lateral direction towards the anode/collector 128, and results in an optimal spreading of the electric potential lines 506A at breakdown. At high current-density current crowding under the gate 108A will cause the electric potential lines 506A will shift towards the anode/collector 128, a phenomena known as the "Kirk Effect" to one of ordinary skill in the art. The LIGBT 100A is disposed on a bonded wafer comprising a device wafer 106 with a thickness of approximately 20 μm bonded to a handle wafer 102 with an intermediate oxide layer 104 (e.g., $SiO_2$), wherein no section of the handle wafer 102 has been removed. Current crowding occurs at an interface between the handle wafer 102 and the intermediate oxide layer 104, limiting the breakdown voltage of this measurement to approximately 465 V.

Figure 5B:
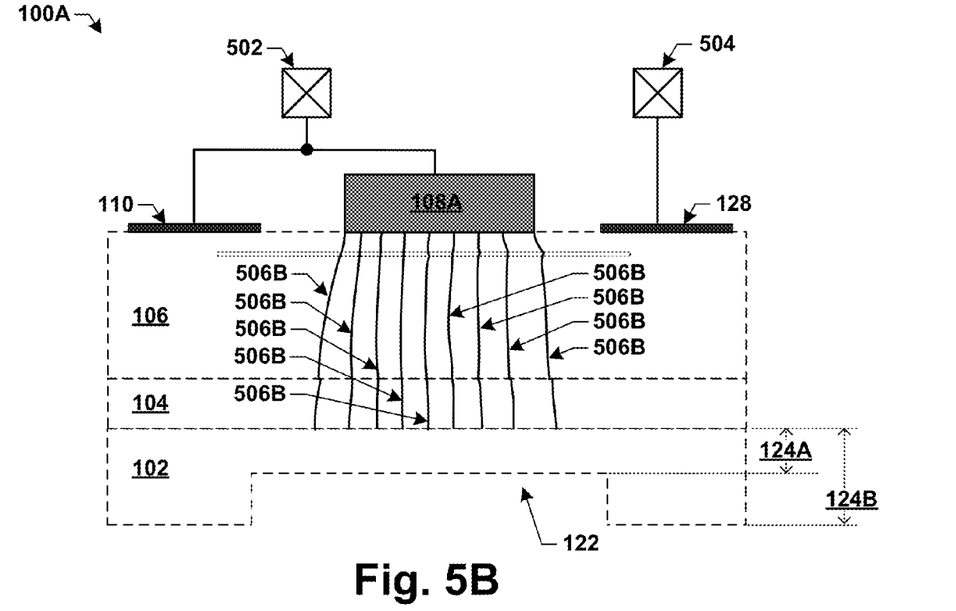

FIG. 5B illustrates some embodiments of a breakdown voltage measurement for the LIGBT 100A formed on a bonded wafer, wherein a section a recess 122 is formed in a lower surface of the handle wafer 102, to define a recessed region with a first handle wafer thickness 124A which is greater than zero. An un-recessed region of the handle wafer 102 has a second handle wafer thickness 124B that is greater than the first handle wafer thickness 124A. Additionally, the device wafer 106 has been thinned to a thickness of approximately 5 μm. The biasing conditions of LIGBT 100A in FIG. 5B are identical to those in FIG. 5A. However, the resulting electric potential lines 506B are emitted from the gate 108A are distributed substantially more uniformly than for the embodiments of FIG. 5A. In particular, no substantial current crowding or substantial Kirk Effect is observed. Formation of the recessed region (122) in conjunction with thinning the device wafer 106 increases the breakdown voltage of the LIGBT 100A to a value greater than approximately 500 V. In addition, a lateral component of electric potential lines 506A of FIG. 5A is substantially removed, resulting in essentially vertical electric potential lines 506B. The breakdown voltage of this embodiment is measured to be approximately 525 V.

Figure 6:
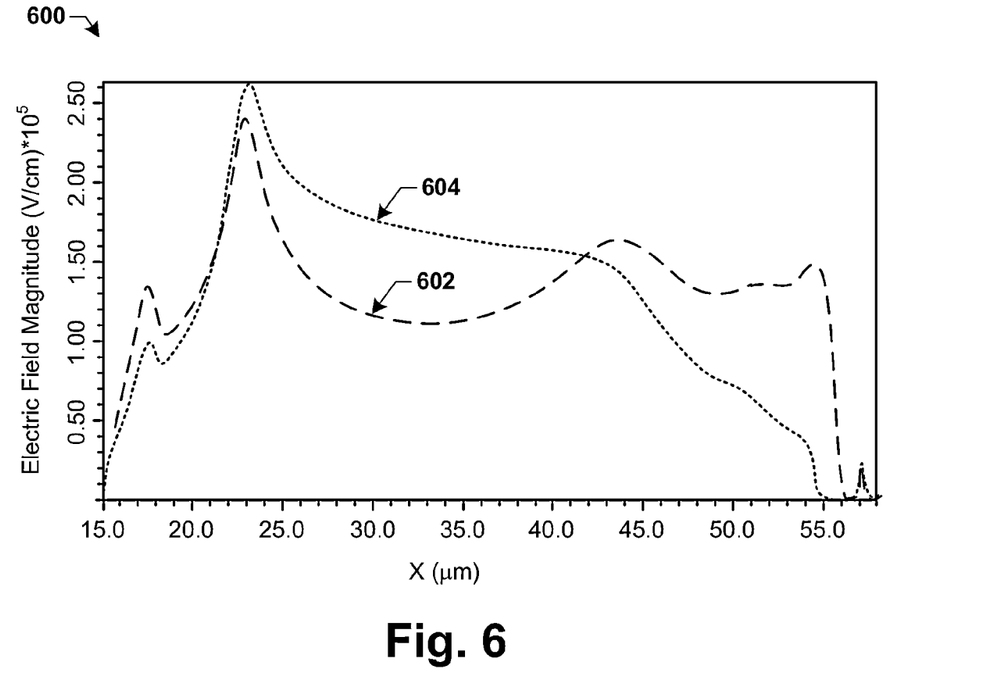
FIG. 6 illustrates a graph of an electric field distribution for a power device in accordance with the present disclosure.

FIG. 6 illustrates a graph 600 of an electric field distribution for the power devices of the embodiments of FIGS. 5A-5B. The electric field magnitude in units of V/cm (i.e., ordinate) is shown, as a function of depth within the bonded wafer in units of μm (i.e., the abscissa), for a first distribution curve 602 measured from the embodiments of FIG. 5A, and a second distribution curve 604 measured from the embodiments of FIG. 5B. The area under each respective curve 602 or 604 yields the breakdown for the LIGBT 100A for each corresponding embodiment of FIGS. 5A-5B. The area under the first distribution curve 602 yields a breakdown voltage of approximately 465 V. The area under the second distribution curve 604 yields a breakdown voltage of approximately 525 V.

Figure 7:
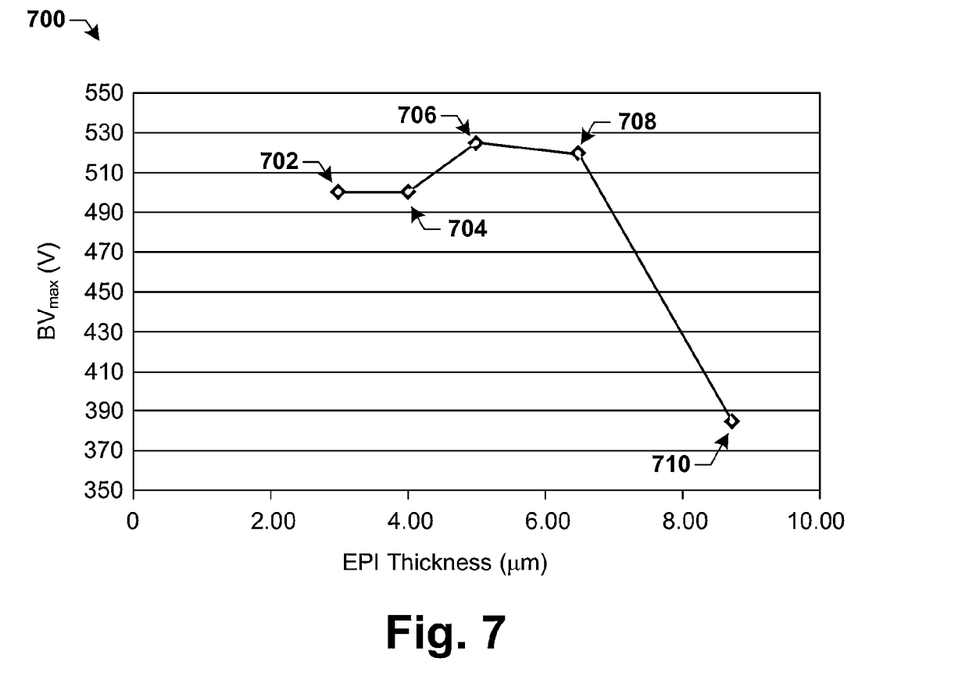
FIG. 7 illustrates a graph of breakdown voltage as a function of device wafer thickness in accordance with the present disclosure.

FIG. 7 illustrates a graph 700 of breakdown voltage as a function of device wafer thickness for a power device. The ordinate of graph 700 is a breakdown voltage for power device in volts (V). The abscissa of graph 700 is device wafer thickness in μm for a device wafer comprising an epitaxial layer of silicon. Data points 702-710 represent breakdown voltage measurements in accordance with the embodiments of FIGS. 5A-5B and FIG. 6 for various device wafer thicknesses. A first device wafer thickness of approximately 3 μm yields a first breakdown voltage value 702 of approximately 500 V, a second device wafer thickness of approximately 4 μm yields a second breakdown voltage value 704 of approximately 500 V, a third device wafer thickness of approximately 5 μm yields a third breakdown voltage value 706 of approximately 525 V, a fourth device wafer thickness of approximately 6.5 μm yields a fourth breakdown voltage value 708 of approximately 520 V, and a fifth device wafer thickness of approximately 8.75 μm yields a fifth breakdown voltage value 710 of approximately 385 V. Therefore, the embodiments of FIG. 7 illustrate a maximum breakdown voltage improvement to approximately 525 V for a device wafer thickness of approximately 5 μm.

While the method 400 has been illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method to increase breakdown voltage of a power device. A power device is formed on an SOI wafer made up of a device wafer, a handle wafer, and an intermediate oxide layer. A recess is formed in a lower surface of the handle wafer to define a recessed region of the handle wafer. The recessed region of the handle wafer has a first handle wafer thickness, which is greater than zero. An un-recessed region of the handle wafer has a second handle wafer thickness, which is greater than the first handle wafer thickness. The first handle wafer thickness of the recessed region provides a breakdown voltage improvement for the power device.

Some embodiments the present disclosure relate to a method, comprising providing a bonded wafer made up of a device wafer, a handle wafer, and an intermediate oxide layer bonding the device wafer to the handle wafer. A semiconductor device is then formed in the device wafer. A recess is then formed in a lower surface of the handle wafer and thereby defines a recessed region of the handle wafer. The recessed region of the handle wafer has a first handle wafer thickness, which is greater than zero. An un-recessed region of the handle wafer has a second handle wafer thickness that is greater than the first handle wafer thickness.

Other embodiments relate to a method, comprising providing a bonded wafer made up of a device wafer having a first conductivity type, a handle wafer, and an intermediate oxide layer bonding the device wafer to the handle wafer. A first implant is performed into an upper surface of the device wafer to form a well having a second conductivity type, wherein the second conductivity type is opposite the first conductivity type. A gate is formed over the upper surface of the device wafer and over a portion of the well, wherein the gate is separated from the device wafer by a gate dielectric. A second implant is performed into the upper surface of the device wafer within the well adjacent the gate to form a first shallow doped region, which has the first conductivity type. A recess is then formed in a lower surface of the handle wafer. The recess defines a recessed region of the handle wafer. The recessed region of the handle wafer has a first handle wafer thickness, which is greater than zero. An un-recessed region of the handle wafer has a second handle wafer thickness that is greater than the first handle wafer thickness.

Still other embodiments relate to a method, comprising providing a bonded wafer made up of a device wafer, a handle wafer, and an intermediate oxide layer bonding the device wafer to the handle wafer, and forming a semiconductor device in an upper surface of the device wafer. The bonded wafer is then flipped so that a lower surface of the handle wafer is facing upwards, and a lower surface of the handle wafer is coated with photoresist. The lower surface of the handle wafer is then aligned with a photomask containing a pattern, wherein the pattern is formed over all or part of the semiconductor device. The lower surface of the handle wafer is then exposed to radiation to transfer the pattern to the photoresist. The pattern is then etched into the lower surface of the handle wafer to form a recessed region of the handle wafer. The recessed region of the handle wafer has a first handle wafer thickness, which is greater than zero. An un-recessed region of the handle wafer has a second handle wafer thickness that is greater than the first handle wafer thickness.

What is claimed is:

1. A method, comprising:
   providing a bonded wafer made up of a device wafer, a handle wafer, and an intermediate oxide layer bonding the device wafer to the handle wafer;
   forming a semiconductor device, which includes a source region and a drain region which are disposed in the device wafer, wherein the intermediate oxide layer separates both the semiconductor device and the device wafer from the handle wafer; and
   forming a recess in a lower surface of the handle wafer while leaving both the intermediate oxide layer and the device wafer entirely in place, thereby defining an un-recessed region and a recessed region of the handle wafer, wherein the un-recessed region has a first handle wafer thickness that is non-zero under the source region and the recessed region has a second handle wafer thickness that is non-zero under the drain region, the second handle wafer thickness being less than the first handle wafer thickness.

2. The method of claim 1, wherein the device wafer has a first conductivity type, and wherein forming the semiconductor device in the device wafer comprises:
performing a first implant into an upper surface of the device wafer to form a well having a second conductivity type, wherein the second conductivity type is opposite the first conductivity type;
forming a gate over the upper surface of the device wafer and over a portion of the well, wherein the gate is separated from the device wafer by a gate dielectric;
performing a second implant into the upper surface of the device wafer within the well adjacent the gate to form a first shallow doped region, which has the first conductivity type; and
performing a third implant into the upper surface of the device wafer within the well adjacent the first shallow doped region to form a second shallow doped region, which has the second conductivity type.

3. The method of claim 2,
wherein the second implant also forms a third shallow doped region, which has the first conductivity type, in the upper surface of the device wafer on an opposite side of the gate from the first and second shallow doped regions, to form the drain region of a laterally diffused metal oxide semiconductor (LDMOS) transistor; and
wherein the first shallow doped region forms the source region of the LDMOS transistor.

4. The method of claim 3, wherein the recessed region extends beneath the device wafer between the gate and the drain region, and wherein the un-recessed region of the handle wafer extends beneath the source region.

5. The method of claim 2,
wherein the third implant also forms a third shallow doped region, which has the second conductivity type, in the upper surface of the device wafer on an opposite side of the gate from the first and second shallow doped regions, to form a collector of a laterally insulated gate bipolar transistor (LIGBT); and
wherein the well forms an emitter of the LIGBT.

6. The method of claim 5, wherein the recessed region extends beneath the device wafer between the gate and the collector, and wherein the un-recessed region of the handle wafer extends beneath the emitter.

7. The method of claim 2, wherein the second shallow doped region forms a body contact region to the well, and wherein the first and second shallow doped regions are connected to a same current source.

8. The method of claim 2, wherein the source region has the first conductivity type within the well beneath a spacer formed along a sidewall of the gate.

9. The method of claim 2, further comprising:
forming a field dielectric layer on the upper surface of the device wafer; and
forming a conductive field plate over the field dielectric layer.

10. The method of claim 2,
wherein the first conductivity type is n-type conductivity; and
wherein the second conductivity type is p-type conductivity.

11. The method of claim 1, wherein forming the recessed region comprises:
coating the lower surface of the handle wafer with photoresist;
aligning the lower surface of the handle wafer with a photomask containing a pattern corresponding to the recessed region;
exposing the lower surface of the handle wafer to radiation to transfer the pattern to the photoresist; and
etching the pattern into the lower surface of the handle wafer.

12. A method, comprising:
providing a bonded wafer made up of a device wafer having a first conductivity type, a handle wafer, and an intermediate oxide layer bonding the device wafer to the handle wafer;
performing a first implant into an upper surface of the device wafer to form a well having a second conductivity type, wherein the second conductivity type is opposite the first conductivity type;
forming a gate over the upper surface of the device wafer and over a portion of the well, wherein the gate is separated from the device wafer by a gate dielectric; and
performing a second implant into the upper surface of the device wafer within the well adjacent the gate to form a first shallow doped region, which has the first conductivity type; and
forming a recess in a lower surface of the handle wafer while leaving the device wafer entirely in place, thereby defining an un-recessed region and a recessed region of the handle wafer, wherein the un-recessed region has a first handle wafer thickness that is non-zero under a source region and the recessed region has a second handle wafer thickness that is non-zero under a drain region, the second handle wafer thickness being less than the first handle wafer thickness.

13. The method of claim 12,
wherein the second implant also forms a second shallow doped region, which has the first conductivity type, in the upper surface of the device wafer on an opposite side of the gate from the first shallow doped region, to form the drain region of a laterally diffused metal oxide semiconductor (LDMOS) transistor; and
wherein the first shallow doped region forms the source region of the LDMOS transistor.

14. The method of claim 13, wherein the recessed region extends beneath the device wafer between the gate and the drain region, and wherein the un-recessed region of the handle wafer extends beneath the source region.

15. The method of claim 12,
wherein a third implant forms a second shallow doped region, which has the second conductivity type, in the upper surface of the device wafer on an opposite side of the gate from the first shallow doped region, to form a collector of a laterally insulated gate bipolar transistor (LIGBT); and
wherein the well forms an emitter of the LIGBT.

16. The method of claim 15, wherein the recessed region extends beneath the device wafer between the gate and the collector, and wherein the un-recessed region of the handle wafer extends beneath the emitter.

17. A method, comprising:
providing a bonded wafer made up of a device wafer, a handle wafer, and an intermediate oxide layer bonding the device wafer to the handle wafer;

forming a semiconductor device in an upper surface of the device wafer;

flipping the bonded wafer so that a lower surface of the handle wafer is facing upwards;

coating the lower surface of the handle wafer with photoresist;

aligning the lower surface of the handle wafer with a photomask containing a pattern, wherein the pattern is formed over all or part of the semiconductor device;

exposing the lower surface of the handle wafer to radiation to transfer the pattern to the photoresist; and etching the pattern into the lower surface of the handle wafer while leaving both the intermediate oxide layer and the device wafer entirely in place to form an un-recessed region and a recessed region of the handle wafer, wherein the un-recessed region has a first handle wafer thickness that is non-zero under a source region and the recessed region has a second handle wafer thickness that is non-zero under a drain region, the second wafer thickness being less than the first wafer thickness.

18. The method of claim 17, wherein the recessed region extends beneath the device wafer between a gate and the drain region of the semiconductor device, and wherein the un-recessed region of the handle wafer extends beneath the source region of the semiconductor device.

19. The method of claim 17, wherein the device wafer has a first conductivity type, and wherein forming the semiconductor device in the device wafer comprises:

performing a first implant into an upper surface of the device wafer to form a well having a second conductivity type, wherein the second conductivity type is opposite the first conductivity type;

forming a gate over the upper surface of the device wafer and over a portion of the well, wherein the gate is separated from the device wafer by a gate dielectric;

performing a second implant into the upper surface of the device wafer within the well adjacent the gate to form a first shallow doped region, which has the first conductivity type; and performing a third implant into the upper surface of the device wafer within the well adjacent the first shallow doped region to form a second shallow doped region, which has the second conductivity type.

20. The method of claim 19, wherein forming the semiconductor device further comprises:

forming a field dielectric layer on the upper surface of the device wafer before forming the gate; and wherein forming the gate also concurrently forms a conductive field plate over the field dielectric layer.

* * * * *